(12) United States Patent
Kato et al.

(10) Patent No.: US 11,359,279 B2
(45) Date of Patent: Jun. 14, 2022

(54) CLEANING METHOD AND FILM DEPOSITION METHOD

(71) Applicant: Tokyo Electron Limited, Tokyo (JP)

(72) Inventors: Hitoshi Kato, Iwate (JP); Makoto Ishigo, Iwate (JP); Jun Sato, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 124 days.

(21) Appl. No.: 16/666,621

(22) Filed: Oct. 29, 2019

(65) Prior Publication Data

US 2020/0141001 A1  May 7, 2020

(30) Foreign Application Priority Data

Nov. 7, 2018 (JP) .............................. JP2018-210060

(51) Int. Cl.
| | | |
|---|---|---|
| C23C 16/44 | (2006.01) | |
| H01J 37/32 | (2006.01) | |
| H01L 21/02 | (2006.01) | |

(52) U.S. Cl.
CPC .... *C23C 16/4405* (2013.01); *H01J 37/32862* (2013.01); *H01L 21/02274* (2013.01)

(58) Field of Classification Search
CPC ........... C23C 16/4405; H01J 37/32862; H01L 21/02274
See application file for complete search history.

(56) References Cited

U.S. PATENT DOCUMENTS

| | | | | |
|---|---|---|---|---|
| 6,322,716 B1* | 11/2001 | Qiao | ..................... | H01J 37/321 216/67 |
| 2004/0084409 A1* | 5/2004 | Deshmukh | ........ | H01L 21/32137 216/63 |
| 2005/0224458 A1* | 10/2005 | Gaudet | ............. | H01J 37/32082 216/67 |
| 2008/0075852 A1* | 3/2008 | Mao | ..................... | C23C 16/4405 427/230 |
| 2008/0317975 A1* | 12/2008 | Furui | ................ | H01J 37/32862 427/575 |
| 2009/0142605 A1* | 6/2009 | Tsukatani | .......... | H01L 21/02002 428/448 |
| 2009/0308840 A1* | 12/2009 | Kohno | ................ | C23C 16/4405 216/37 |
| 2015/0050815 A1 | 2/2015 | Yanagisawa et al. | | |
| 2015/0340261 A1* | 11/2015 | Katayama | ........... | H01L 21/6833 269/8 |
| 2016/0300713 A1* | 10/2016 | Cui | ..................... | C23C 16/4404 |
| 2017/0062227 A1* | 3/2017 | Ishikawa | ............. | H01L 21/3065 |
| 2018/0033661 A1* | 2/2018 | Lee | ................... | H01L 21/67766 |
| 2019/0360092 A1* | 11/2019 | Sato | ................. | H01L 21/68757 |

FOREIGN PATENT DOCUMENTS

| | | |
|---|---|---|
| JP | 2010-153805 | 7/2010 |
| JP | 2011-058031 | 3/2011 |
| JP | 2013-222948 | 10/2013 |
| WO | 2013/146278 | 10/2013 |

* cited by examiner

*Primary Examiner* — Sharidan Carrillo

(74) *Attorney, Agent, or Firm* — IPUSA, PLLC

(57) ABSTRACT

A cleaning method for dry cleaning a susceptor disposed in a process chamber of a film deposition apparatus is provided. In the method, a protective member is placed on a substrate receiving region provided in the susceptor. A cleaning gas is supplied to the susceptor having the protective member placed on the substrate receiving region, thereby removing a film deposited on a surface of the susceptor by etching.

12 Claims, 16 Drawing Sheets

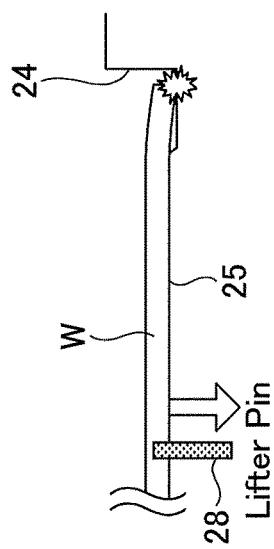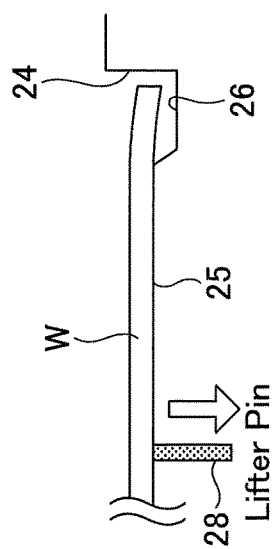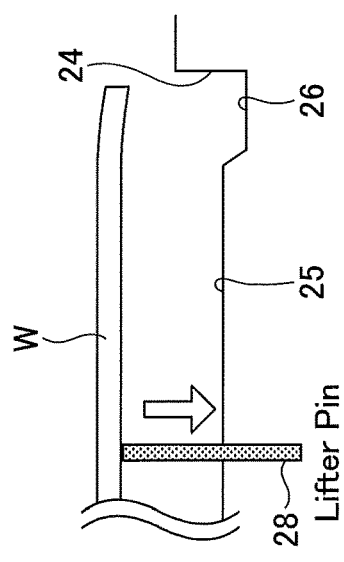

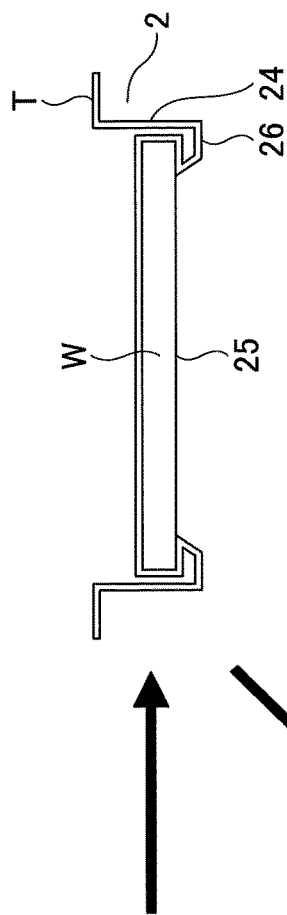
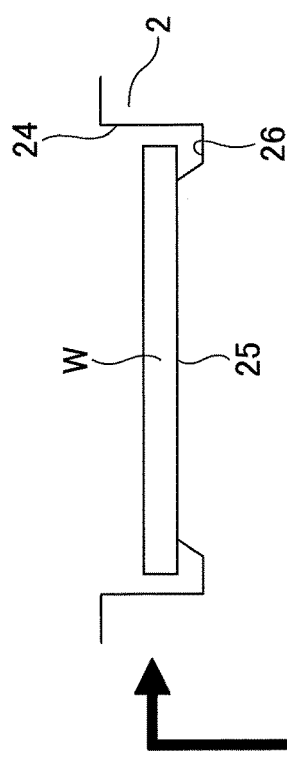
FIG.23A  FIG.23B  FIG.23C  FIG.23D
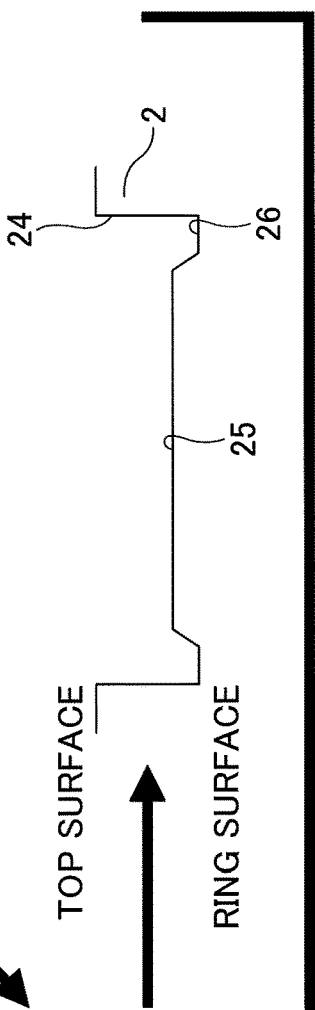
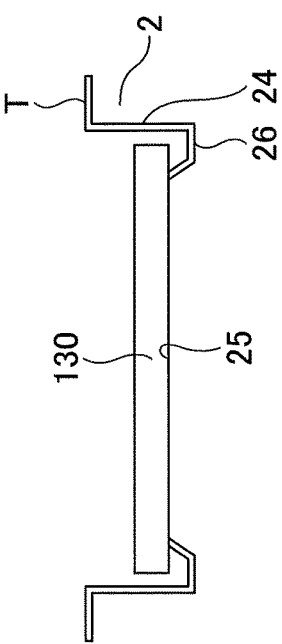

CLEANING METHOD AND FILM DEPOSITION METHOD

CROSS-REFERENCE TO RELATED APPLICATIONS

This patent application is based upon and claims priority to Japanese Patent Application No. 2018-210060, filed on Nov. 7, 2018, the entire contents of which are incorporated herein by reference.

BACKGROUND OF THE INVENTION

1. Field of the Invention

The disclosure relates to a cleaning method and a film deposition method.

2. Description of the Related Art

Japanese Patent Application Publication No. 2010-153805 discloses a method of cleaning a film deposition apparatus that includes steps of: rotating a rotatable susceptor that is disposed in a chamber of a film deposition apparatus and includes a substrate receiving region in one face, supplying a cleaning gas to a reverse concave space that is disposed above the susceptor and is defined by a first concave member that opens toward the one surface of the susceptor, and evacuating the cleaning gas through a gas flow passage defined between the first concave member and a second concave member that covers the first concave member.

SUMMARY OF THE INVENTION

The present disclosure provides a cleaning method and a film deposition method for cleaning using etching without damaging a susceptor.

In order to achieve the above-described object, a cleaning method according to one aspect of the present disclosure is provided for dry cleaning a susceptor disposed in a process chamber of a film deposition apparatus. In the method, a protective member is placed on a substrate receiving region provided in the susceptor. A cleaning gas is supplied to the susceptor having the protective member placed on the substrate receiving region, thereby removing a film deposited on a surface of the susceptor by etching.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIGS. 22A to 22C are diagrams illustrating an example of a problem arising from a conventional cleaning method; and FIGS. 23A to 23D are diagrams illustrating an example a cleaning method according to an embodiment of the present disclosure.

DETAILED DESCRIPTION OF THE PREFERRED EMBODIMENTS

Embodiments for carrying out the present disclosure are described below with reference to the accompanying drawings.

[Film Deposition Apparatus]

To begin with, an example of a film deposition apparatus suitable for applying a cleaning method and a film deposition method according to an embodiment of the present disclosure will be described with reference to FIGS. 1 to 6. As illustrated in FIGS. 1 to 4, the film deposition apparatus includes a vacuum chamber 1 having an approximately circular shape in a plan view, and a susceptor 2 provided in the vacuum chamber 1 having a center of rotation that coincides with the center of the vacuum chamber 1 and made of, for example, quartz. The film deposition apparatus is configured to perform a film deposition process on a wafer W. As will be described in detail later, the film deposition apparatus is configured to prevent a particle from adhering to a wafer W while inhibiting a decrease in throughput and ensuring uniformity of the film deposition process across the plane, even when, for example, the film deposition process is performed on a wafer W that is deformed in a protruding shape (convex upward). Subsequently, each part of the film deposition apparatus will be described below.

Figure 1:
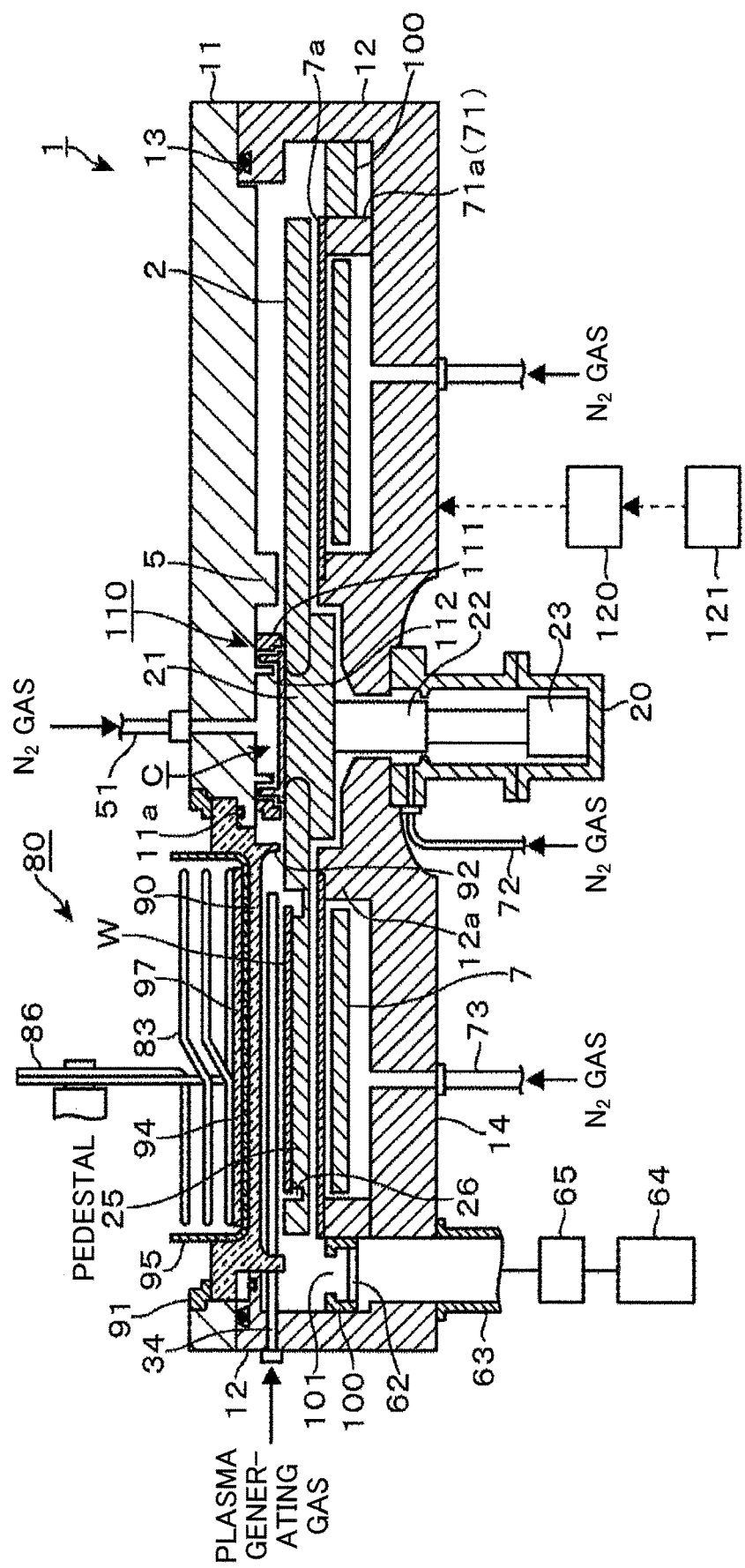
FIG. 1 is a vertical cross-sectional view illustrating a film deposition apparatus to which a cleaning method and a film deposition method according to an embodiment of the present disclosure are applicable.

The vacuum chamber 1 includes a top plate 11 and a chamber body 12 so that the top plate 11 can be detached from the chamber body 12. A separation gas supply tube 51 is connected to the central portion of the top plate 11 to supply nitrogen ($N_2$) gas as a separation gas in order to inhibit different processing gases from mixing with each other in a central region C in the vacuum chamber 1. FIG. 1 also illustrates a seal member 13, such as an O-ring, provided in a ring-like manner on the periphery of the top surface of the chamber body 12.

On the upper side of the bottom portion 14 of the vacuum chamber 1, as illustrated in FIG. 1, a heater unit 7 that serves as a heating mechanism is disposed, and the wafer W on the susceptor 2 is heated to a deposition temperature, for example, 300 degrees Celsius, via the susceptor 2. FIG. 1 illustrates a cover member 71a provided on the side of the heater unit 7, and a cover member 7a covering the upper side of the heater unit 7. On the bottom portion 14, a plurality of purge gas supply tubes 73 for purging the space disposed in the heater unit 7 are disposed at a plurality of locations along a circumferential direction below the heater unit 7.

The susceptor 2 is secured to an approximately cylindrical core portion 21 at its center and is configured to be rotatable about a vertical axis in a clockwise fashion in this example by a rotary shaft 22 connected to the lower surface of the core portion 21 and extending vertically. FIG. 1 illustrates a drive unit (a rotating mechanism) 23 that rotates the rotary shaft 22 about a vertical axis, and a case 20 that accommodates the rotary shaft 22 and the driving unit 23. An upper flange portion of the case 20 on the upper surface side is attached to the lower surface of the bottom portion 14 of the vacuum chamber 1 in an airtight manner. A purge gas supply tube 72 is connected to the case 20 for supplying nitrogen gas as a purge gas to the lower region of the susceptor 2. The outer circumferential side of the core portion 21 of the bottom portion 14 of the vacuum chamber 1 is formed into a ring-like shape so as to approach toward the lower side of the susceptor 2 while forming a protrusion 12a.

Figure 2:
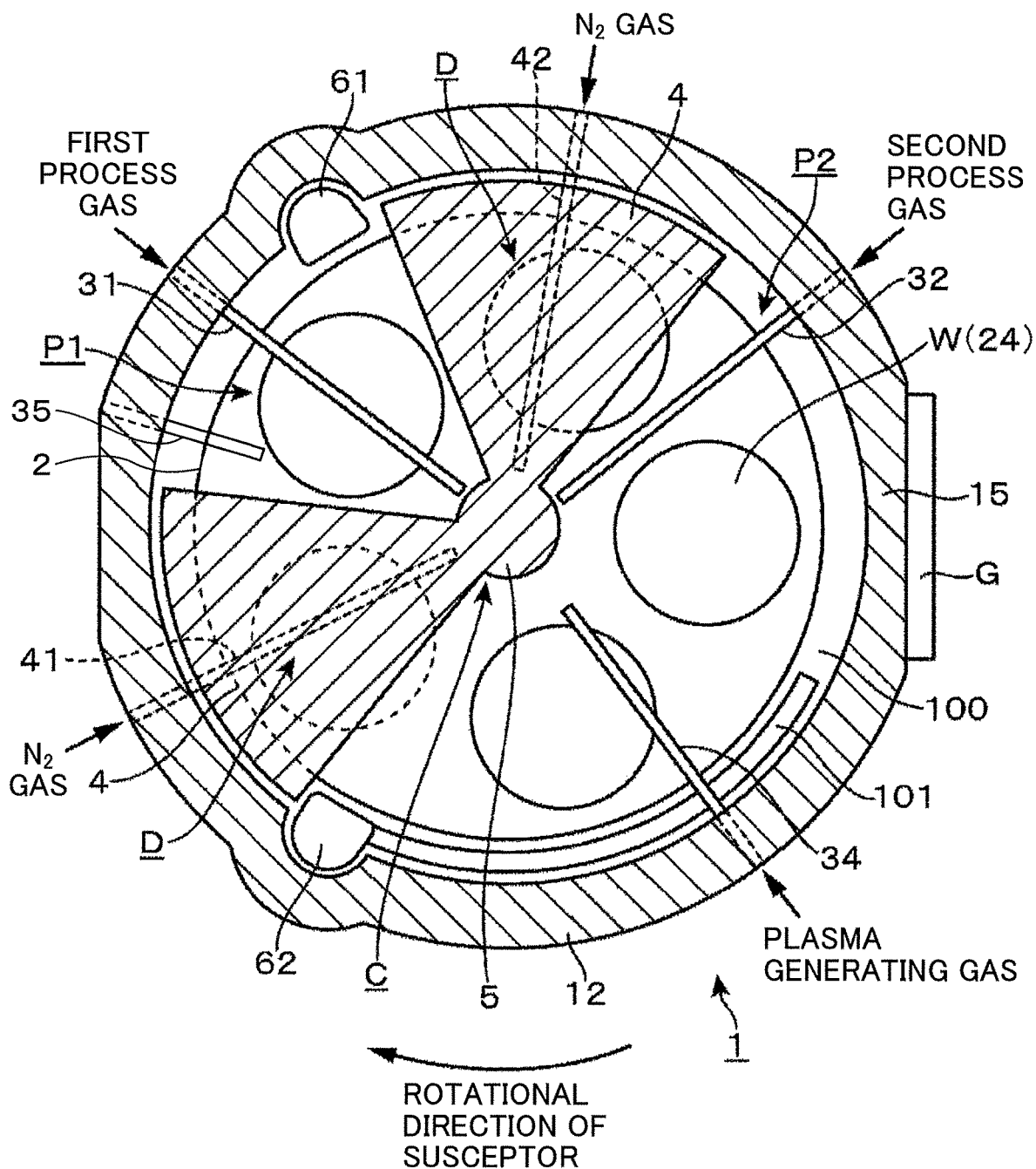
FIG. 2 is a cross-sectional plan view of a film deposition apparatus according to an embodiment of the present disclosure.
Figure 3:
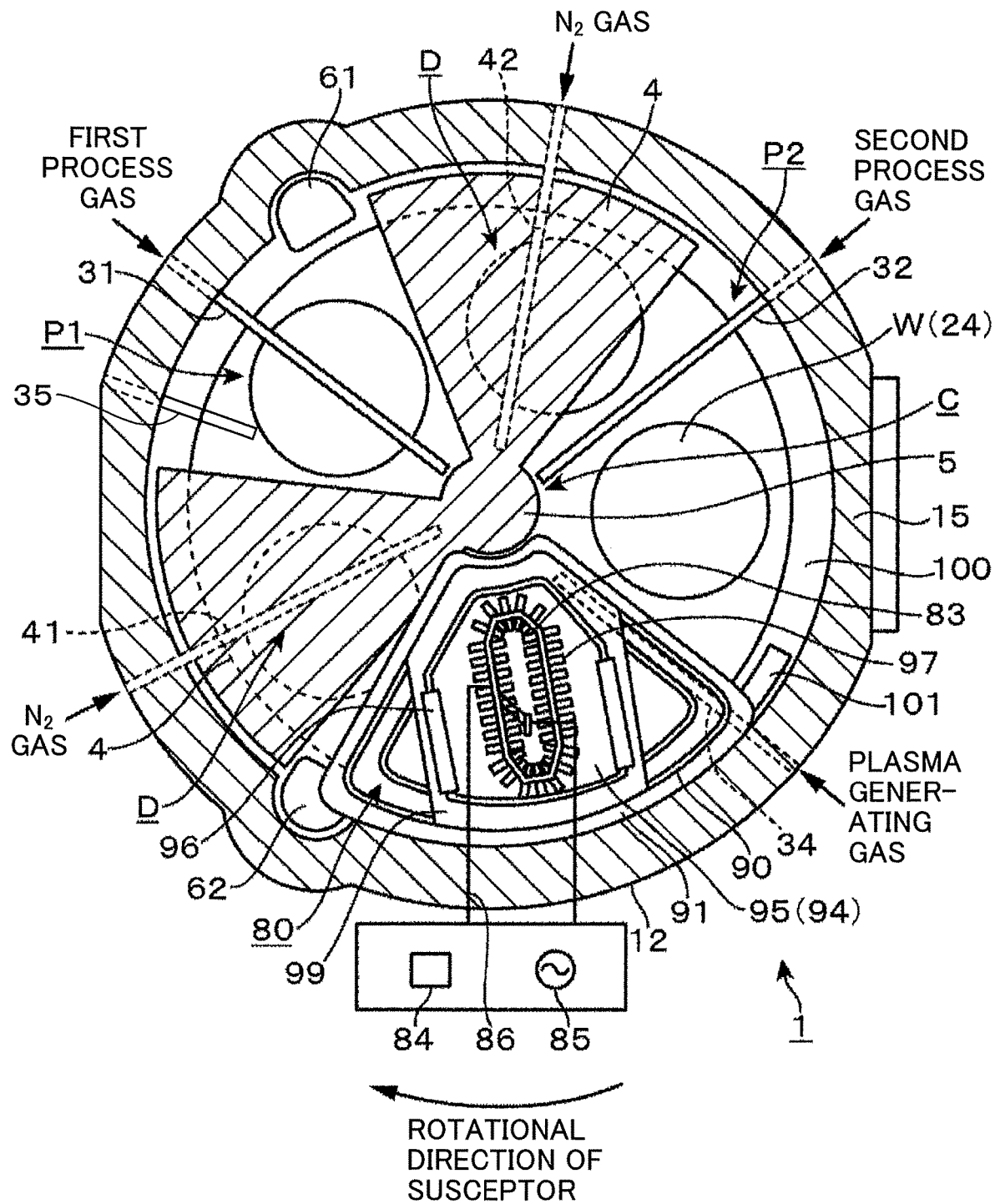
FIG. 3 is a cross-sectional plan view according to an embodiment of the present disclosure.
Figure 4:
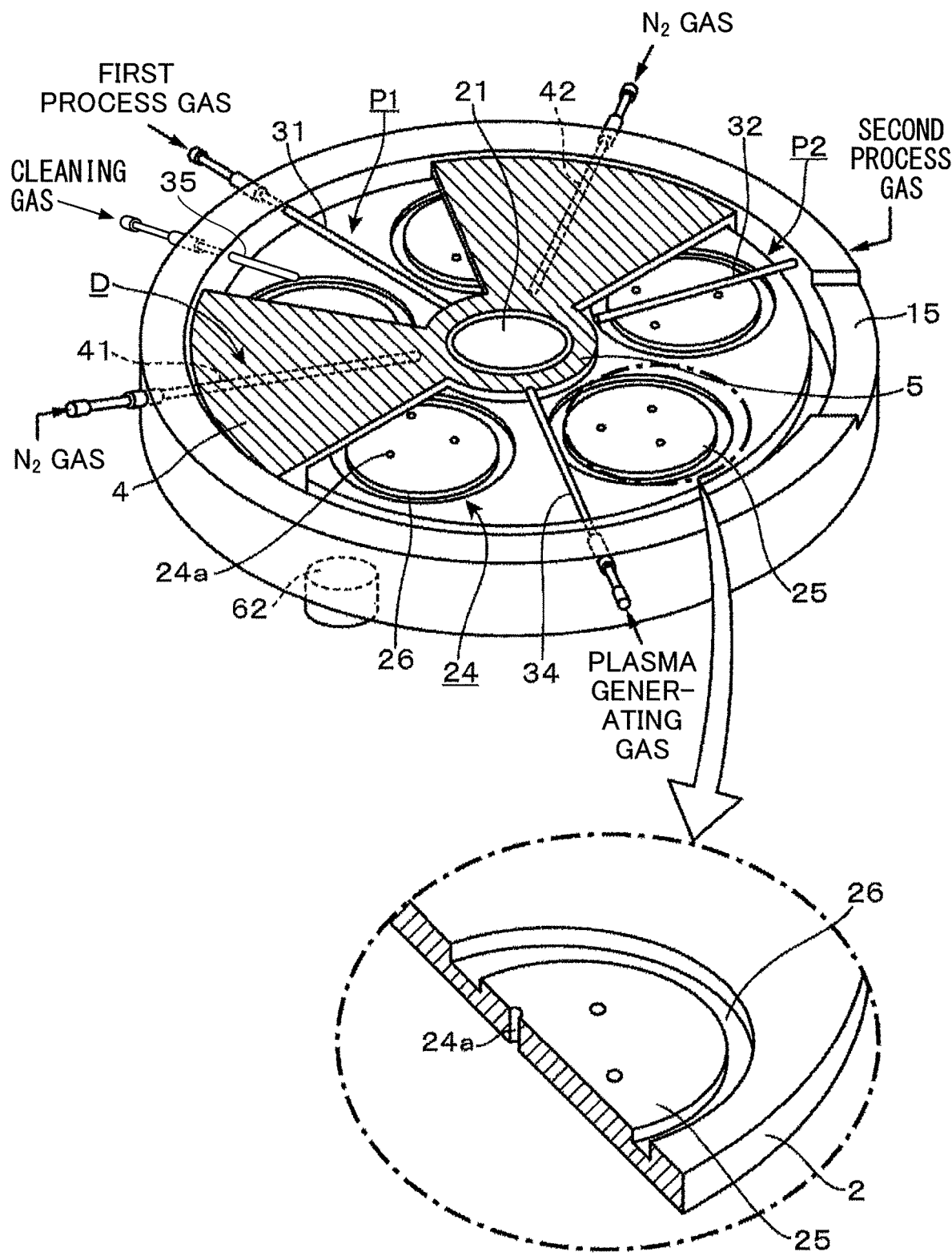
FIG. 4 is a perspective view illustrating a part of the interior of a film deposition apparatus according to an embodiment of the present disclosure.
Figure 5:
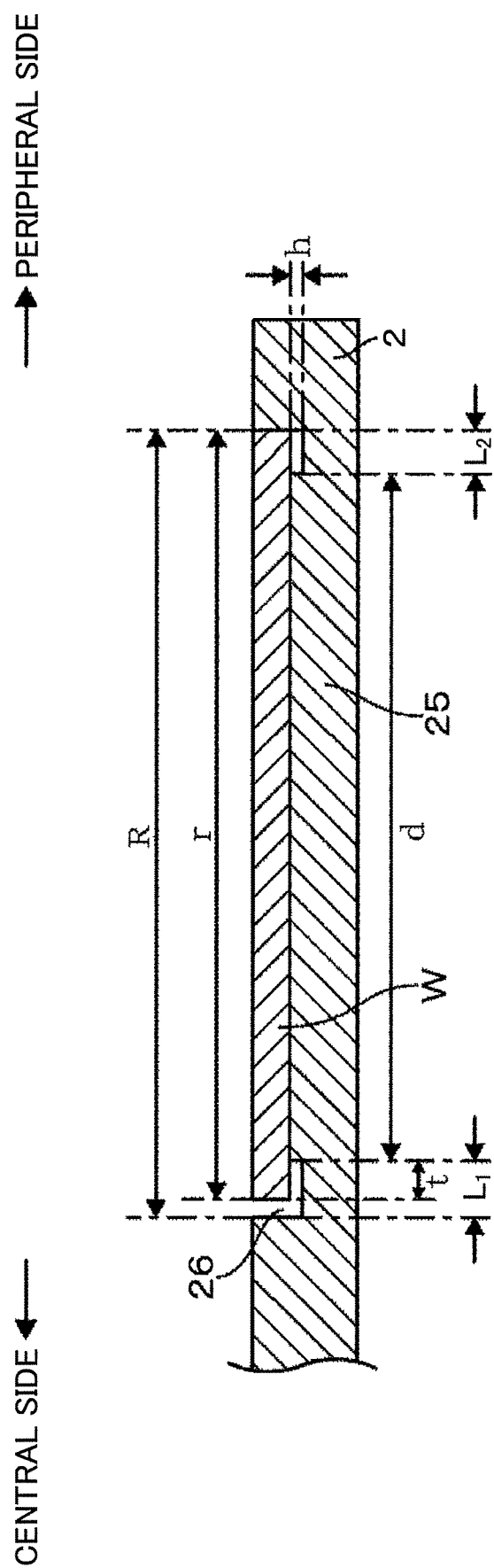
FIG. 5 is a vertical cross-sectional view of a part of a film deposition apparatus according to an embodiment of the present disclosure.

On the surface of the susceptor 2, as illustrated in FIGS. 2 and 3, a circular recess 24 is provided as a substrate receiving region for holding a wafer W made of a disk-shaped (circular) silicon. The recess 24 is formed in a plurality of locations, for example, five locations along the rotational direction (circumferential direction) of the susceptor 2. Each recess 24 is formed so that the diameter thereof is larger than that of the wafer W as seen in a plan view to provide a clearance between the outer edges of the wafer W and the inner surface of the recess 24. Specifically, the diameter dimension r of the wafer W and the diameter dimension R of the recess 24 are, for example, 300 mm and 302 mm, respectively, as illustrated in FIG. 5. The diameter of the susceptor 2 is about 1000 mm, for example. FIG. 4 illustrates through holes 24a through which, for example, three lift pins (not illustrated) protrude to move the wafer W up and down from the lower side. In FIGS. 2 and 3, the depiction of the diameter dimension R of the recess 24 is simplified and the depiction of the through holes 24a is omitted except for FIG. 4.

Figure 6:
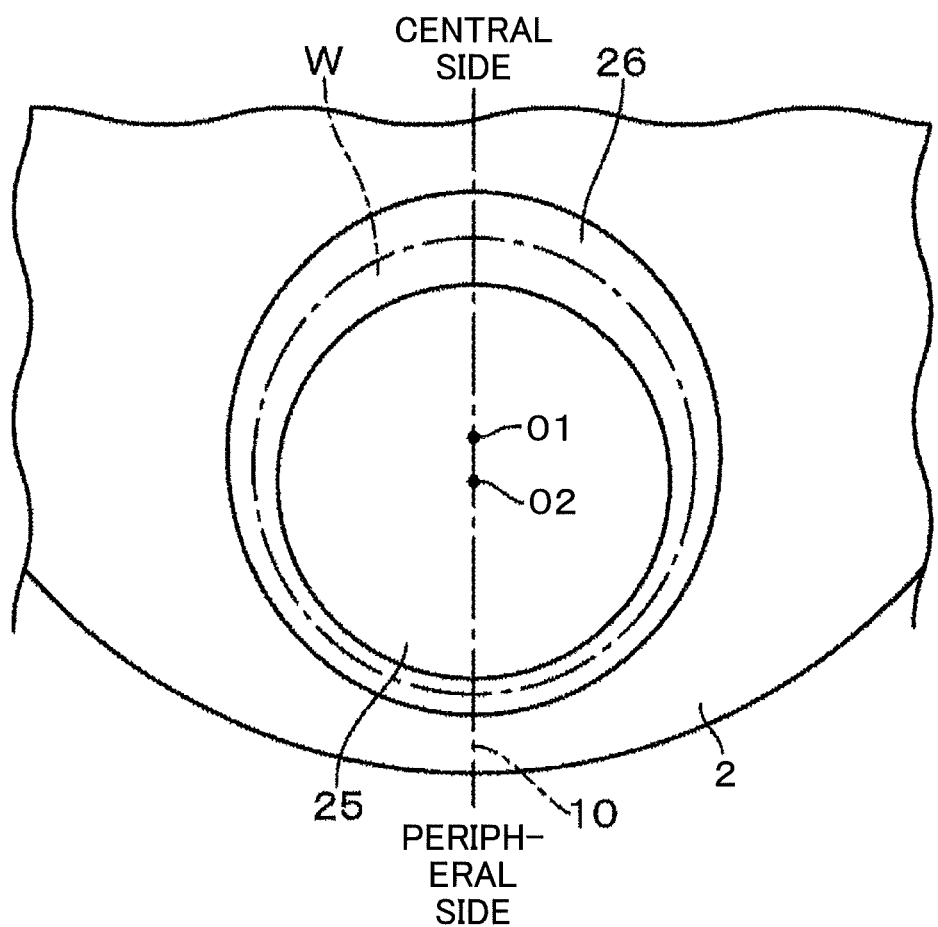
FIG. 6 is a plan view illustrating a part of a turntable of a film forming apparatus according to an embodiment of the present disclosure.

On the bottom surface of each recess 24, as illustrated in FIGS. 4 to 6, a pedestal 25 for supporting the central portion of the wafer W from the lower side is provided as a protruding portion. Each pedestal 25 is configured to be a flat cylindrical shape and has a horizontal surface. The pedestals 25 are formed so that the periphery of the wafer W is distant from the bottom surface of the recess 24 in a circumferential direction, that is, the periphery does not touch the pedestal 25 (horizontally sticking out from the pedestal 25), and are smaller than the wafer W as seen in a plan view. Accordingly, the pedestal 25 is formed so that when the wafer W is placed on the pedestal 25, the outer edge (peripheral edge) of the wafer W faces the bottom surface of the recess 24 in a circumferential direction. Thus, it can be said that a ring-shaped groove 26 is formed between the inner wall surface of the recess 24 and the outer wall surface of the pedestal 25. The height dimension h of the pedestal 25 is about 0.03 mm to about 0.2 mm in this example. When the wafer W is mounted on the pedestal 25, the lower surface of the wafer W is set to be lower than the surface of the susceptor 2 so that the surface of the wafer W is aligned with the surface of the susceptor 2. The diameter dimension d of the pedestal 25 is, for example, 297 mm.

As illustrated in FIGS. 5 and 6, the pedestal 25 is positioned to be eccentric with respect to the recess 24 toward the outer peripheral portion of the susceptor 2 as seen in a plan view. Specifically, when seen in a plan view, if the center positions of the recesses 24 and the pedestals 25 are O1 and O2, respectively, the center positions O2 are 0.5 mm distant, for example, from the center positions O1 on the outer peripheral side of the susceptor 2. Accordingly, in this example, as illustrated in FIG. 6, the center positions O1 and O2 are arranged on a line 10 extending along the radial direction of the susceptor 2 so as to be radially spaced apart from each other.

At this time, when the width dimension (dimension between the inner wall surface of the recess 24 and the outer wall surface of the pedestal 25) of the groove 26 as seen in a plan view is referred to as a "width dimension L" and the width dimension L on the center side and the outer peripheral side of the susceptor 2 is numbered "1" to "2", respectively, the width dimension L1 and the width dimension L2 are 3 mm and 2 mm, respectively. The width dimension L in the direction of rotation of the susceptor 2 is the dimension between the width dimension L1 and the width dimension L2, and decreases from the center side to the outer peripheral side. Thus, the width dimension L is 2 mm to 3 mm across the circumferential direction. When the outer edge of the wafer W contacts the inner peripheral surface of the recess 24 due to the centrifugal force of the susceptor 2, the length dimension (protrusion amount) t in which the outer edge of the wafer W protrudes from the upper edge of the pedestal 25 becomes 1 mm to 2 mm in the circumferential direction. The reason why the pedestal 25 is thus eccentric with respect to the recess 24 will be described in detail below. In FIG. 6 and the like, the width dimension L is exaggerated and drawn large.

First, the case in which the wafer W is directly placed on the bottom surface of the recess 24 without the pedestal 25 will be described. As described in detail above, if the unprocessed wafer W before being placed on the susceptor 2 is at an ordinary temperature, when the wafer W is placed on the susceptor 2, a temperature variation occurs in the surface, and the temperature variation decreases while the temperature increases toward the deposition temperature. On the other hand, if another heat treatment has been already performed on the wafer W by a heat treatment device other than the film deposition apparatus, heat spontaneously radiates from the wafer W in the course of conveying the wafer to the film deposition apparatus, and the temperature cooling rate at this time is non-uniform in the surface of the wafer W. Therefore, when the wafer W is placed on the susceptor 2, the temperature variation of the wafer W is already caused, and the temperature variation gradually decreases due to the heat input from the susceptor 2.

Figure 7:
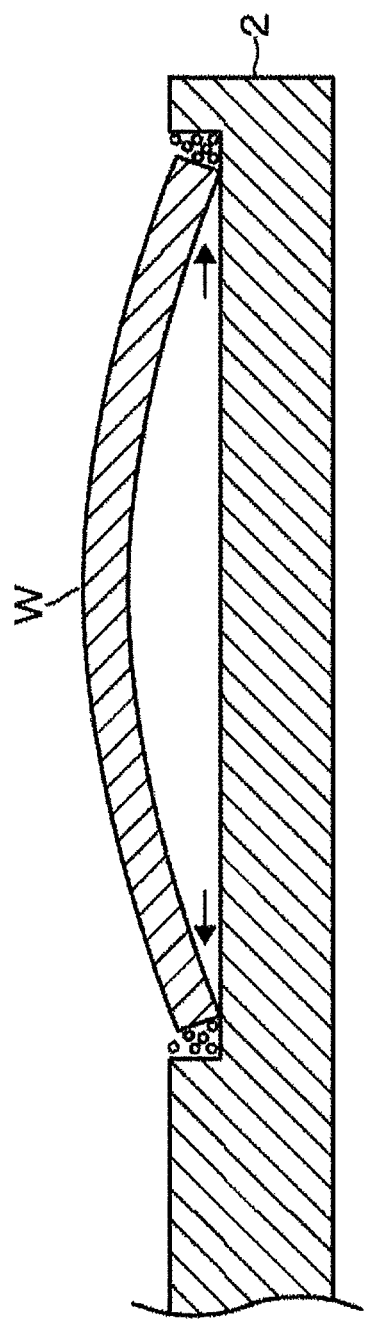
FIG. 7 is a vertical cross-sectional view illustrating operation of a conventional turntable.
Figure 8:
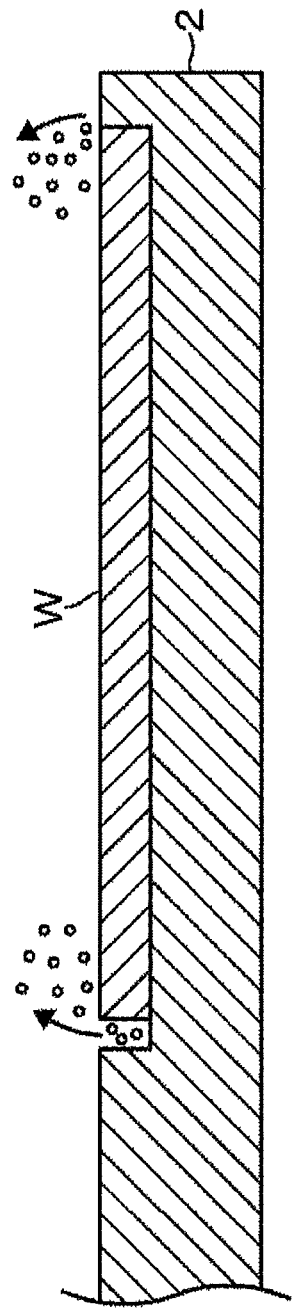
FIG. 8 is a vertical cross-sectional view illustrating operation of a conventional turntable.

Therefore, when the unprocessed wafer W is placed on the susceptor 2, the temperature variation occurs in the surface, regardless of whether the wafer is at room temperature or the heat treatment has been already performed. At this time, based on the temperature variation of the wafer W, the wafer W may deform like a mountain (protruding upward in the center), and when the wafer W deforms like a mountain, the wafer W will contact the susceptor 2 at the outer edge while the central portion is spaced from the surface of the susceptor 2. When the wafer W is placed directly on the bottom surface of the recess 24 as illustrated in FIG. 7, the outer edge of the wafer W and the surface of the susceptor 2 (in particular, the bottom surface of the recess 24) rub against each other and particles are generated when the wafer W extends flat as the temperature of the wafer W becomes uniform. As illustrated in FIG. 8, the particles are adhered to the surface of the wafer W by traveling around the outer edge of the wafer W when, for example, the wafer W extends horizontally. Accordingly, in order to minimize the number of particles deposited on the surface of the wafer W, it is not preferable to place the wafer W directly on the bottom surface of the recess 24.

Figure 9:
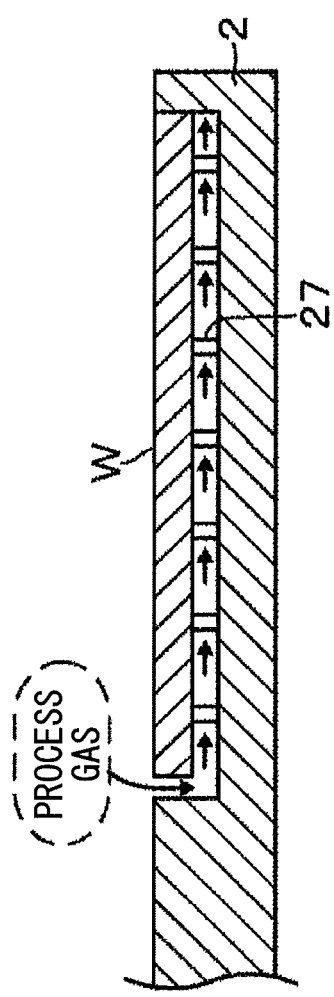
FIG. 9 is vertical cross-sectional view illustrating operation of a conventional turntable.

Meanwhile, as illustrated in FIG. 9, when a plurality of pin-shaped protrusions 27 having a height of about 30 μm or about 150 μm are provided on the bottom surface of the recess 24, and when the wafer W is supported in a floating state through these protrusions 27, the outer edge of the wafer W is apart from and above the bottom surface of the recess 24. For this reason, even when the wafer W deforms like a mountain, because the generation of the above-mentioned particles is reduced, adherence of the particles on the surface of the wafer W is also reduced. However, when the wafer W is floated and supported in this manner, the processing level across the surface (for example, the thickness of the thin film) becomes non-uniform as illustrated in the examples below. That is, because a part of the process gas supplied to the outer periphery of the wafer W is circulated around the back surface of the wafer W, the amount of the process gas supplied to the outer periphery is smaller than that of the central portion, and the process varies within the surface. Further, because the heating temperature of the wafer W is slightly different from each other between the portions in contact with the protrusions 27 and the portions floating from the bottom surface of the recesses 24, among adjacent protrusions 27 and 27, the processing level in the surface of the wafer W also varies. In addition, when the process gas is for film deposition (adsorbed gas), the particle adheres to the back surface of the wafer W by the amount of the process gas that has circulated around the edge and has reached the back surface. Accordingly, when the wafer W is supported in a floating state as described above, particle adherence on the upper surface of the wafer W is inhibited, but the processing uniformity and the particles on the back surface are not preferable.

Accordingly, by providing the above-mentioned pedestal 25 at the bottom surface of the recess 24, the outer edge of the wafer W does not contact the bottom surface of the recess 24, and the flow of the process gas to the back surface of the wafer W is decreased. Therefore, good results are considered to be obtained with respect to the particles on the upper surface side of the wafer W, the particles on the back surface side of the wafer W, and the uniformity of processing. That is, when the wafer W is supported by the pedestal 25, both advantages are considered to be obtained of the case where the wafer W is directly placed on the bottom surface of the recess 24 (FIG. 7 and FIG. 8) and where the wafer W is supported without touching the bottom surface of the recess 24 (FIG. 9). In the meantime, the recess 24 is formed large with respect to the wafer W, and the wafer W is rotated by the susceptor 2 during the process. The centrifugal force due to the rotation of the susceptor 2, therefore, moves the wafer W during the process by the amount of clearance between the outer edge of the wafer W and the inner edge of the recess 24 to a position closer to the outer periphery of the susceptor 2 within the recess 24. Accordingly, if the pedestal 25 is just placed in the center of the recess 24, the technique of Japanese Patent Application Publication No. 2010-153805 described in the background section does not provide good results with respect to the particle or processing uniformity on the upper surface of the wafer W.

Figure 10:
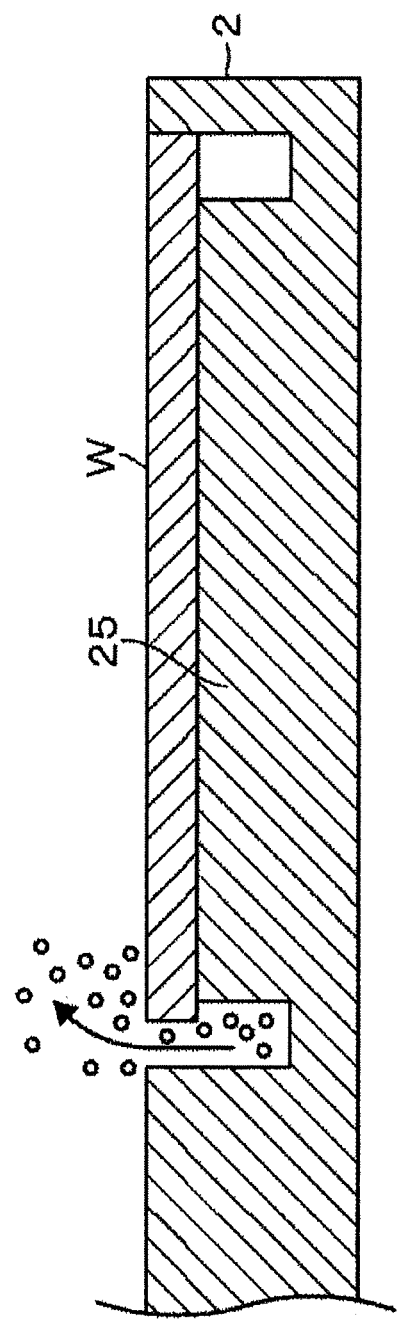
FIG. 10 is a vertical cross-sectional view illustrating operation of a conventional turntable.

Specifically, if the pedestal 25 is disposed at the center of the recess 24 (when both the width dimensions L1 and L2 are set at 2.5 mm), when the wafer W is moved toward the outer peripheral portion of the corresponding susceptor 2 in the recess 24 due to the centrifugal force of the susceptor 2, as illustrated in FIG. 10, at the center of the susceptor, the amount t of protrusion of the outer edge of the wafer W from the upper edge of the pedestal 25 is about 0.5 mm, which is smaller than the outer peripheral side (2.5 mm). Therefore, when a particle is generated on the back side of the wafer W at the central portion of the susceptor 2, the particle may go around the outer edge of the wafer W and adhere to the surface of the wafer W.

Figure 11:
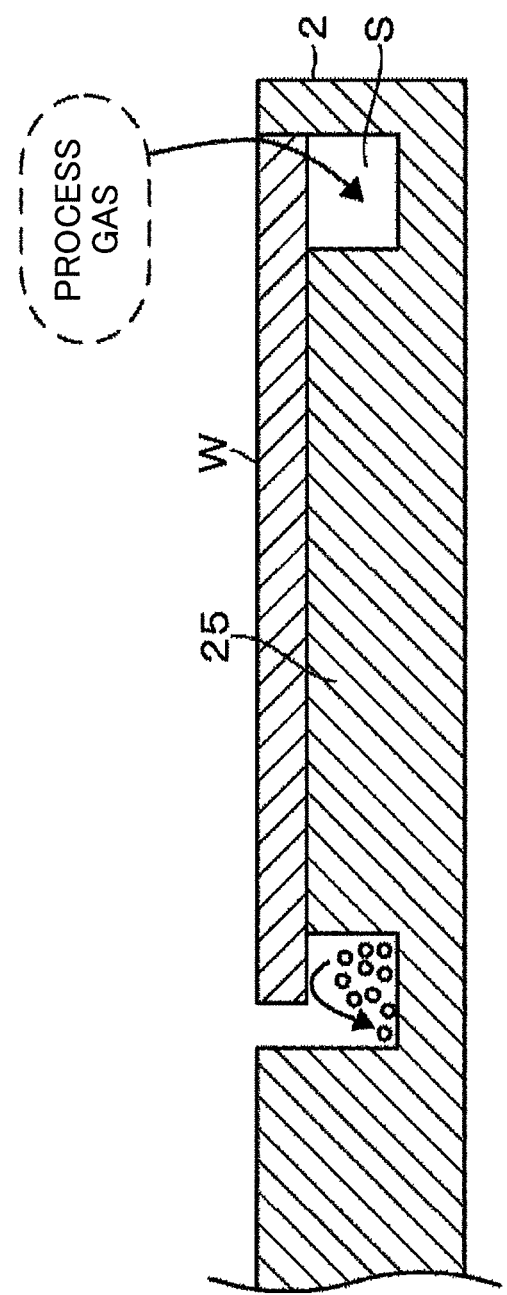
FIG. 11 is a vertical cross-sectional view illustrating operation of a conventional turntable.
Figure 12:
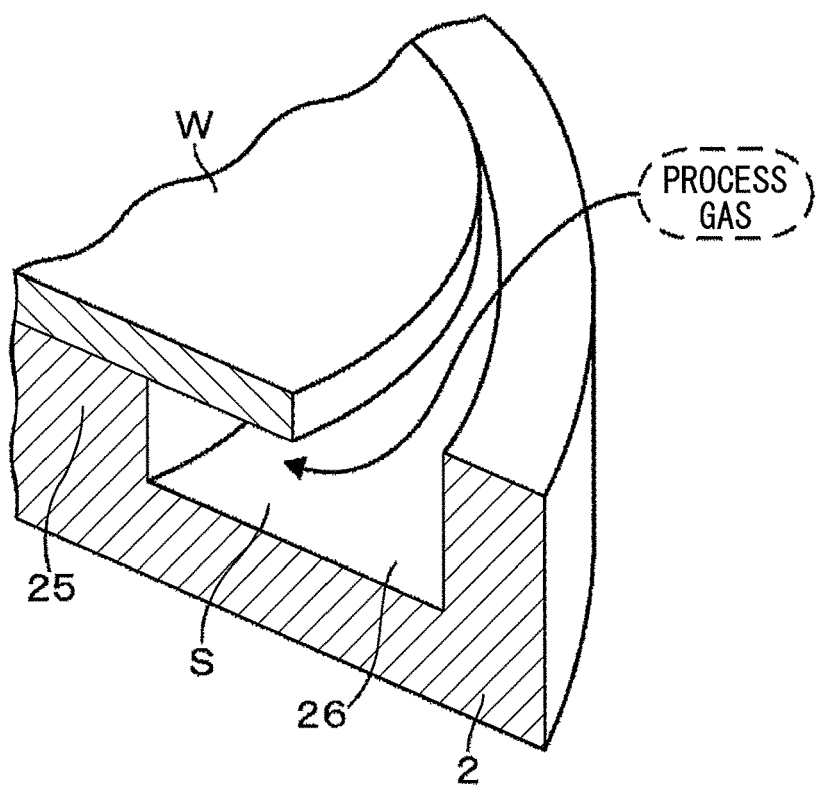
FIG. 12 is vertical cross-sectional view illustrating operation of a conventional turntable.

On the other hand, as illustrated in FIG. 11, when the diameter dimension d of the pedestal 25 is shortened so that a sufficient protrusion amount t of about 1 mm, for example, is secured at the central portion of the susceptor 2 even if the wafer W is displaced toward the outer peripheral portion of the susceptor 2 due to the centrifugal force of the susceptor 2, the circulation of the particle around the surface of the wafer W is decreased at the central portion. Specifically, for example, the diameter dimension d is set to be 296 mm, and when both the width dimensions L1 and L2 are set to be 3.0 mm, the protrusions t at the center side and the outer peripheral side are 1 mm and 3 mm, respectively. However, because the protrusion amount t is too large on the outer peripheral portion side of the susceptor 2, and because a wide space S is formed on the lower side of the outer edge of the wafer W, as illustrated in FIG. 12, the process gas flows into the space S. As a result, the process in the surface of the wafer W becomes uneven and the particles easily adhere to the back surface of the outer edge. In other words, when the large space S is formed on the back surface side of the wafer W, the same characteristic deterioration as the characteristic deterioration that occurs when the wafer W is supported by the protrusions 27 occurs on the back surface side, as illustrated in FIG. 9.

Therefore, in the present invention, as described in detail above, the pedestal 25 is formed at an eccentric position with respect to the recess 24 at the outer peripheral portion of the susceptor 2. Specifically, an example of the method of forming the pedestal 25 will be described. When setting the protrusion amount t of the outer edge of the wafer W to a certain dimension, the outer peripheral end of the pedestal 25 is formed at a position on the outer peripheral side of the susceptor 2 at a distance of the protrusion amount t from the inner edge of the recess 24 on the outer peripheral side of the susceptor 2 toward the central side of the susceptor 2. On the central portion side of the susceptor 2, the outer peripheral end of the pedestal 25 is set to a position where, from the inner edge of the recess 24 on the central portion side of the susceptor 2, a distance obtained by adding the clearance between the outer edge of the wafer W and the inner edge of the recess 24 to the protrusion amount t is close to the outer peripheral portion side. Thus, because the wafer W is circular and thus the pedestal 25 is also circular, the pedestal 25 is formed at an eccentric position with respect to the recess 24 on the outer circumferential side of the susceptor 2 so that the central positions O1 and O2 are arranged so as to be spaced apart from each other in the radial direction of the susceptor 2.

In this example, the dimensions of the center side and the outer peripheral side of the susceptor 2 are set to 1 mm and 2 mm, respectively, for the aforementioned protrusion amount t. Therefore, the diameter dimension d of the pedestal 25 is 297 mm (=302 mm (diameter of the recess 24)–1 mm (protrusion amount t on the center side)–2 mm (protrusion amount t on the outer peripheral side)–2 mm (clearance size between the recess 24 and the wafer W))). The width dimension L1 is the size (3 mm) obtained by adding the aforementioned clearance dimension to the central protrusion amount t, and the width dimension L2 is the same size as that of the outer circumferential protrusion amount t (=2 mm).

Subsequently, as illustrated in FIGS. 2 and 3, the six nozzles 31, 32, 34, 35, 41, and 42 made of, for example, quartz are radially disposed so as to be spaced apart from each other in the circumferential direction of the vacuum chamber 1 at a position facing each other with the passing region of the recess 24 described above. Each of these nozzles 31, 32, 34, 35, 41, and 42 is mounted, for example, so as to extend horizontally from the outer peripheral wall of the vacuum chamber 1 toward the central region C while facing the wafer W. In this example, the plasma generating gas nozzle 34, the separation gas nozzle 41, the cleaning gas nozzle 35, the first process gas nozzle 31, the separation gas nozzle 42, and the second process gas nozzle 32 are arranged in this order in a clockwise fashion (rotational direction of the susceptor 2) as seen from the transfer port 15 described below. On the upper side of the plasma generating gas nozzle 34, a plasma generator 80 is provided, as illustrated in FIG. 1, to convert a gas discharged from the plasma generating gas nozzle 34.

The process gas nozzles 31 and 32 form a first process gas supply part and a second process gas supply part, respectively, and the separation gas nozzles 41 and 42 form separate gas supply parts, respectively. The cleaning gas nozzle 35 forms a cleaning gas supply part. FIGS. 2 and 4 illustrate a state in which the plasma generator 80 and a housing 90 described below are removed so that the plasma generating gas nozzle 34 for generating plasma is visible, and FIG. 3 illustrates a state in which the plasma generator 80 and the housing 90 are mounted.

Each nozzle 31, 32, 34, 35, 41, 42 is connected to each of the following gas sources (not illustrated) via a flow control valve. That is, the first process gas nozzle 31 is connected to a source of a first process gas including Si (silicon), such as a BTBAS (bis(tertiary-butyl amino) silane), and $SiH_2$ $(NH—C(CH_3)_3)_2$ gas. The second process gas nozzle 32 is connected to a source of a mixture of the second process gas, for example, ozone ($O_3$) gas and oxygen ($O_2$) gas, particularly an oxygen gas source with an ozonizer. The plasma generating gas nozzle 34 is connected to a source of plasma generating gas that is, for example, a mixture of argon (Ar) gas and oxygen gas. The separation gas nozzles 41 and 42 are each connected to a gas source of nitrogen ($N_2$) gas that is the separation gas. The gas discharge holes 33 are formed, for example, equally spaced at a plurality of locations along the radial direction of the susceptor 2 on the underside of the gas nozzles 31, 32, 34, 41, and 42, for example.

The regions under the process gas nozzles 31 and 32 are a first process region P1 for adsorbing the first process gas on the wafer W, and a second process region P2 for causing a component of the first process gas adsorbed on the wafer W to react with the second process gas, respectively. The separation gas nozzles 41, 42 are provided to form separation regions D that separate the first process region P1 from the second process region P2, respectively. The top plate 11 of the vacuum chamber 1 in the separation regions D includes approximately fan-shaped convex portions 4, and the separation gas nozzles 41 and 42 are housed in the convex portions 4, as illustrated in FIGS. 2 and 3. Accordingly, both circumferential sides of the susceptor 2 in the separation gas nozzles 41 and 42 have lower ceiling surfaces that are lower surfaces of the convex portions 4 in order to prevent the process gases from mixing with each other, and both circumferential sides of the low ceiling surfaces have higher ceiling surfaces than the low ceiling surfaces. The periphery of the convex portion 4 (the portion on the outer periphery of the vacuum chamber 1) is bent in an L-shape to face the outer end surface of the susceptor 2 and is slightly apart from the chamber body 12 in order to prevent the process gases from mixing with each other.

Next, the plasma generator 80 will be described. The plasma generator 80 is configured by coiling an antenna 83 made of metal wire and is disposed to cross the passing region of the wafer W from the central portion side to the outer peripheral portion side of the susceptor 2. The antenna 83 is connected to a high frequency power source 85, for example, having a frequency of 13.56 MHz and, for example, an output power of 5000 W via a matching box 84, and is arranged to be hermetically insulated from the inside of the vacuum chamber 1. That is, the top plate 11 above the plasma generating gas nozzle 34 as described above has an opening having an approximately fan shape as seen in a plan view, and is hermetically sealed by the housing 90 made of, for example, quartz. The housing 90 is formed so that the periphery extends horizontally in a circumferential direction, and the center portion is depressed toward the inner area of the vacuum chamber 1, and the antenna 83 is housed inside the housing 90. FIG. 1 illustrates a sealing member 11a provided between the housing 90 and the top plate 11, and a pressing member 91 for pressing the peripheral edge of the housing 90 downwardly. Also, FIG. 1 illustrates a connection electrode 86 for electrically connecting the plasma generator 80 to the matching box 84 (see FIG. 3) and the radio frequency power source 85 (see FIG. 3).

The lower surface of the housing 90 vertically extends downward (toward the side of the susceptor 2) and along a circumferential direction as illustrated in FIG. 1 to prevent the entry of $N_2$ gas, $O_3$ gas, or the like into the area under the housing 90 and forms a projection 92 for gas regulation. The inner peripheral surface of the projection 92, the lower surface of the housing 90, and the area surrounded by the upper surface of the susceptor 2 contain the aforementioned plasma generating gas nozzle 34.

As illustrated in FIGS. 1 and 3, an approximately box-shaped Faraday shield 95 is disposed between the housing 90 and the antenna 83, and the Faraday shield 95 is formed and grounded by a metal plate that is an electrically conductive plate. On the bottom surface of the Faraday shield 95, a slit 97 formed in a circumferential direction perpendicular to the winding direction of the antenna 83 is provided under the antenna 83 in order to prevent the electric field component of the electric and magnetic fields (the electromagnetic fields) generated at the antenna 83 from going downward toward the wafer W and to allow the magnetic field to reach the wafer W. An insulating plate 94 made of quartz, for example, is interposed between the Faraday shield 95 and the antenna 83 to isolate the Faraday shield 95 from the antenna 83.

A ring-shaped side ring 100 is disposed at a position slightly below the susceptor 2 on the outer periphery of the susceptor 2, and two exhaust ports 61 and 62 are formed in the upper surface of the side ring 100 to be circumferentially distant from each other. In other words, two exhaust openings are formed in the bottom surface 14 of the vacuum chamber 1, and the exhaust ports 61 and 62 are formed in the side ring 100 at positions corresponding to the exhaust openings. One of these two exhaust ports 61 and 62, and the other are referred to as the first exhaust port 61 and the second exhaust port 62, respectively. The first exhaust port 61 is formed at a position closer to the separation area D between the first processing gas nozzle 31 and the separation area D at the rotational downstream side of the susceptor from the first processing gas nozzle 31. The second exhaust port 62 is formed at a position closer to the separation area D between the plasma generating gas nozzle 34 and the separation area D downstream of the plasma generating gas nozzle 34 in the rotational direction of the susceptor 2.

The first exhaust port 61 evacuates the first process gas and the separation gas, and the second exhaust port 62 evacuates the plasma generating gas in addition to the second process gas and the separation gas. The first and second exhaust ports 61 and 62 evacuate the cleaning gas during cleaning. A groove-like gas flow passage 101 is formed in the upper surface of the side ring 100 on the outer edge side of the housing 90 for allowing a gas to flow through the second exhaust port 62 while avoiding the housing 90. Each of the first exhaust port 61 and the second exhaust port 62 is connected to a vacuum pumping mechanism, for example, a vacuum pump 64, via an exhaust pipe 63 that includes a pressure regulator 65, such as a butterfly valve, as illustrated in FIG. 1.

In the center portion of the lower surface of the top plate 11, as illustrated in FIG. 2, a protrusion 5 is formed in a circumferential direction continuously from a portion of the central region C of the convex portion 4, and the protrusion 5 is formed in the same height as the lower surface of the convex portion 4. A labyrinth structural portion 110 is disposed above the core portion 21 at the rotational center of the susceptor 2 from the protrusion 5 so as to prevent the first and second process gases from mixing with each other in the central region C. The labyrinth structure 110 has a radially alternating configuration of a first wall portion 111 extending in a circumferential direction from the susceptor 2 side toward the top plate 11, and a second wall portion 112 extending in a circumferential direction from the top plate 11 toward the susceptor 2.

As illustrated in FIGS. 2 and 3, the side wall of the vacuum chamber 1 includes a transfer port 15 for transferring the wafer W between the external transfer arm (not illustrated) and the susceptor 2. The transfer port 15 is airtightly opened and closed by the gate valve G. Lifting pins (not illustrated) for lifting the wafer W from the back side through the through holes 24a of the susceptor 2 are provided at the lower side of the susceptor 2 at a position facing the transfer port 15.

The film deposition apparatus includes a controller 120 that is constituted of a computer for controlling the operation of the entire apparatus. The memory of the controller 120 contains a program for performing the film deposition process and the treatment process, which will be described later. In this program, a group of steps is configured to execute the operation of the apparatus described below, and a storage unit 121, which is a storage medium such as a hard disk, a compact disk, an optical disk, a memory card, and a flexible disk, is installed in the controller 120.

[Film Deposition Method]

Next, a film deposition method according to an embodiment of the present disclosure will be described. The film deposition method according to the present embodiment includes a film deposition step and a cleaning step. That is, when the film deposition process is performed on the wafer W in the film deposition step, the film deposition process is performed on the surface of the susceptor 2, and a thin film is deposited on the susceptor 2. In removing a thin film on such a susceptor 2, a cleaning method according to an embodiment of the present disclosure is performed. In the cleaning method according to the present embodiment, an etching gas that can remove a thin film by etching is used as a cleaning gas, and the cleaning gas is supplied to the susceptor 2 in the vacuum chamber 1, and the thin film deposited on the surface of the susceptor 2 is etched off by dry cleaning. In the dry cleaning, not only the surface of the susceptor 2 but also the inner wall of the vacuum chamber 1 and the parts inside the vacuum chamber 1 are cleaned.

With respect to the cleaning frequency, the cleaning may be performed for each deposition process performed by placing 5 to 6 wafers W on the susceptor 2, or the cleaning may be performed after the deposition process is repeated multiple times, for example, once for a predetermined number of times, such as once for two to three times. In addition, the film thickness of the thin film deposited on the susceptor 2 may be also measured, and the cleaning may be performed each time the film thickness reaches a predetermined thickness. In either case, at least one deposition process is performed, and then the cleaning is performed.

In accordance with the sequence of a series of processes, a film deposition process will be described at first.

Figure 13:
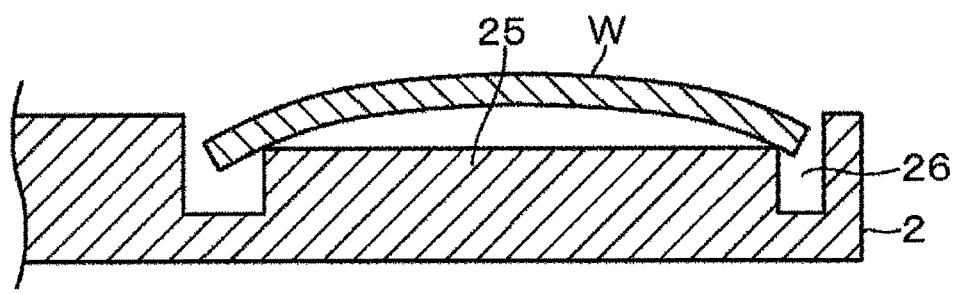
FIG. 13 is a vertical cross-sectional view illustrating operation of a turntable according to an embodiment of the present disclosure.

To begin with, when performing the film deposition process, the susceptor 2 is already heated by the heater unit 7 so that the wafer W to be placed on the susceptor 2 reaches a film deposition temperature of about 300 degrees Celsius. Then, while the gate valve G is opened and the susceptor 2 is intermittently rotated, for example, five wafers W are placed on the susceptor 2 via the transfer port 15 by a transfer arm (not illustrated). The wafers W are each loaded in a central location in the recess 24 and are therefore spaced (and not contacted) circumferentially from the inner peripheral surface of the recess 24. On this occasion, each wafer W may be at an ordinary temperature or may be placed on the susceptor 2 after another heat treatment has already been performed thereon, and the wafer W may deform like a mountain due to a temperature variation within the surface of the wafer W, as illustrated in FIG. 13.

Figure 14:
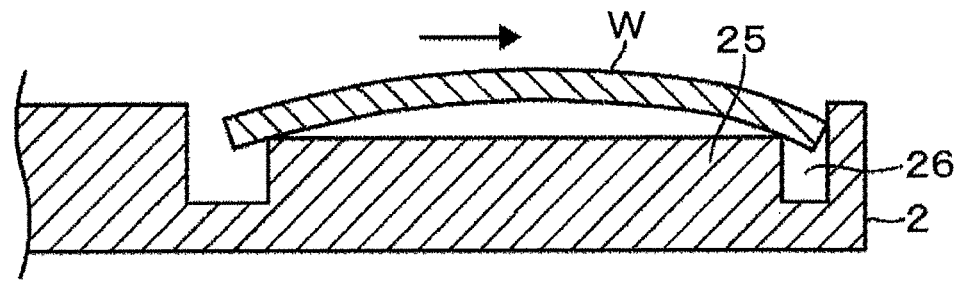
FIG. 14 is a vertical cross-sectional view illustrating operation of a turntable according to an embodiment of the present disclosure.

Next, the gate valve G is then closed and the vacuum pump 64 continuously evacuates the vacuum chamber 1 while the susceptor 2 is rotated clockwise, for example, at a rotational speed in a range from 2 rpm to 240 rpm. Each wafer W moves toward the outer periphery of the susceptor 2 in the recess 24 due to the centrifugal force of the rotation of the susceptor 2 as illustrated in FIG. 14. On this occasion, because the susceptor 2 is rotated without waiting for the time until the wafer W reaches the deposition temperature, if the wafer W deforms into a mountain shape, the wafer W moves toward the outer periphery before the wafer W becomes flat (while keeping the deformed shape). Even in this case, when the wafer W moves, because the outer edge of the wafer W is away from the surface of the susceptor 2 or the surface of the pedestal 25, the generation of particles caused by sliding between the outer edge and the pedestal 25 is decreased.

Figure 15:
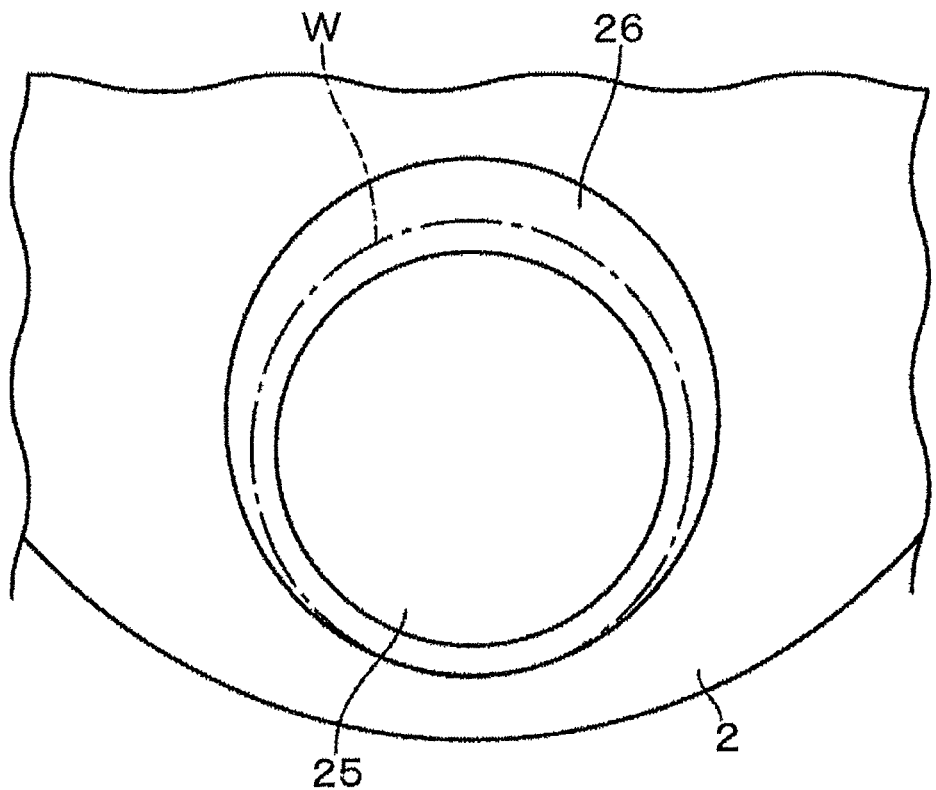
FIG. 15 is a plan view illustrating operation of a turntable according to an embodiment of the present disclosure.

On this occasion, when the susceptor 2 is rotated from the stationary state, each wafer W remains stationary due to inertial force, so that the wafer is moved to the rear side in the rotational direction of the susceptor 2 (in the direction opposite to the rotational direction of the susceptor 2). However, because the wafer W is pushed by the aforementioned centrifugal force so that the outer edge of the wafer W contacts the inner peripheral surface of the recess 24 at the outer peripheral portion of the susceptor 2, the position of the wafer W in the rotational direction of the susceptor 2 is regulated by the internal wall of the recess 24 and the centrifugal force, and as a result, the protrusion amount t at both sides of the rotational direction is aligned as illustrated in FIG. 15. Therefore, when the wafer W is rotated by the susceptor 2, the protrusion amount t becomes 1 mm to 2 mm in the circumferential direction.

Figure 16:
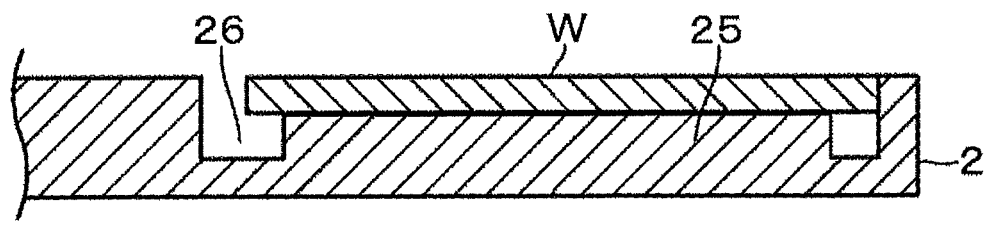
FIG. 16 is a vertical cross-sectional view illustrating operation of a turntable according to an embodiment of the present disclosure.

Then, during the film deposition process described below or before starting the supply of each process gas, heat input from the susceptor 2 gradually increases the temperature of the wafer W toward the film deposition temperature, and the temperature of the wafer W is adjusted at this film deposition temperature throughout the surface. Accordingly, the wafer W is planarized as illustrated in FIG. 16, even if the wafer W deforms like a mountain. At this time, because the wafer W is planarized, the outer edge of the wafer W is moved outwardly while extending, but because the outer edge of the wafer W is apart from the pedestal 25 (i.e., does not contact the pedestal 25), the generation of particles is similarly decreased.

Figure 17:
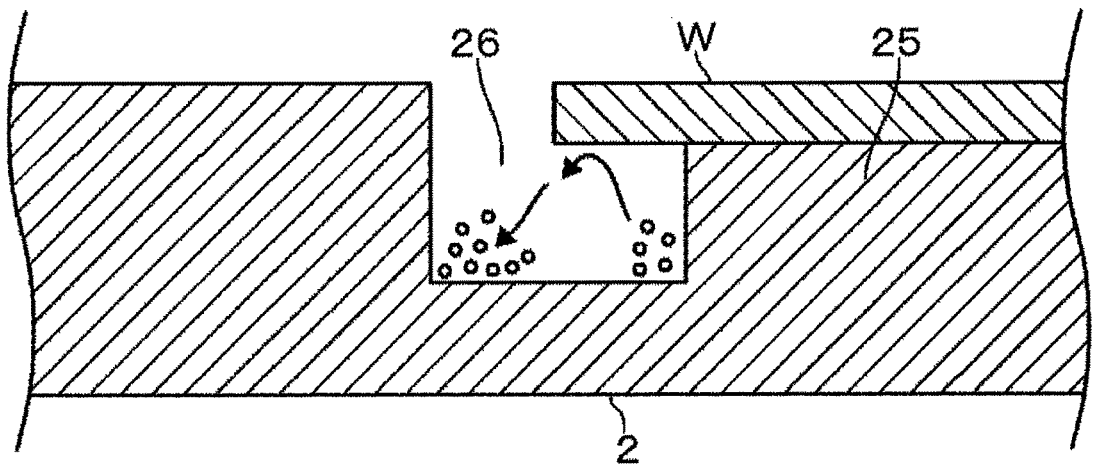
FIG. 17 is a vertical cross-sectional view illustrating operation of a turntable according to an embodiment of the present disclosure.
Figure 18:
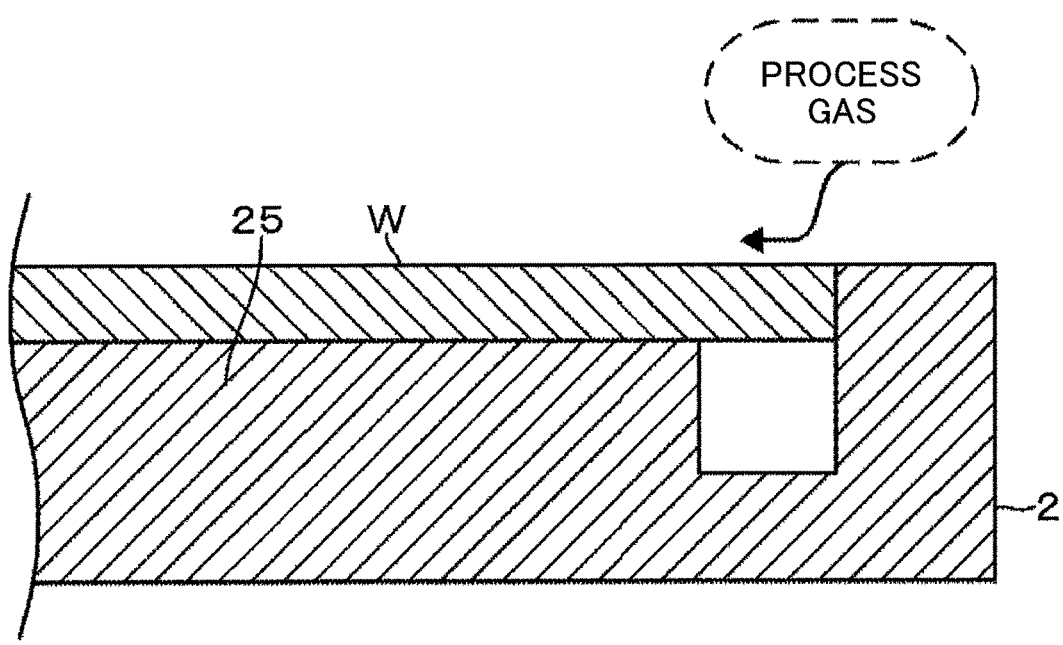
FIG. 18 is a vertical cross-sectional view illustrating operation of a turntable according to an embodiment of the present disclosure.

On this occasion, when the wafer W moves toward the outer circumferential portion of the susceptor 2 due to the centrifugal force of the susceptor 2, particles are generated because the back surface of the wafer W rubs against the surface of the pedestal 25. However, as illustrated in FIG. 17, as seen from the particles on the back side of the wafer W, the outer edge of the wafer W extends horizontally along a circumferential direction at the length of 1 mm to 2 mm. Therefore, because the particles are less likely to float around the outer edge of the wafer W, adhesion of the particles to the upper surface of the wafer W is inhibited.

The first process gas and the second process gas are discharged from the process gas nozzles 31 and 32, respectively, and the plasma generating gas is discharged from the plasma generating gas nozzle 34. The separation gas is discharged from the separation gas nozzles 41 and 42 at a predetermined flow rate, and nitrogen gas is also discharged from the separation gas supply tube 51 and the purge gas supply tubes 72 at predetermined flow rates. The inside of the vacuum chamber 1 is adjusted to a preset processing pressure by the pressure regulator 65, and high frequency power is supplied to the plasma generator 80.

On this occasion, each process gas supplied to the wafer W is likely to circulate in a region on the back side of the wafer W through a gap between the outer edge of the wafer W and the inner peripheral surface of the recess 24. However, as described above, the amount of protrusion t is set, and because there is no large space into which the gas readily flows around to the region, the gas flowing around the edge of the wafer W and going into the space is inhibited. Accordingly, the particle adhesion on the back side of the wafer W is inhibited, and each process gas is uniformly supplied to the surface of the wafer W. In addition, because the protrusion amount t is set as described above, the temperature of the wafer W becomes uniform in the region above the pedestal 25, and heat is transferred to the outer peripheral portion through the region. Thus, the temperature of each wafer W becomes uniform across the surface thereof.

The first process gas adsorbs on the surface of the wafer W in the first process region P1 by rotating the susceptor 2, and the reaction between the first process gas adsorbed on the wafer W and the second process gas occurs in the second process region P2. A molecular layer or layers of a silicon oxide film ($SiO_2$), which is a thin film component, is formed, thereby forming a reaction product. On this occasion, the reaction product may contain impurities such as water (OH group) and organic matter, for example, because of the residue group contained in the first process gas.

In the meantime, on the lower side of the plasma generator 80, the electric field and magnetic field generated by the high frequency power supplied from the high frequency power source 85 are reflected or absorbed (attenuated) by the Faraday shield 95, thereby preventing (blocking) the electric field from entering the vacuum chamber 1. The magnetic field passes through the slit 97 of the Faraday shield 95 and through the bottom surface of the housing 90 into the vacuum chamber 1. Thus, the plasma generating gas discharged from the plasma generating gas nozzle 34 is activated by the magnetic field passing through the slit 97 to produce plasma such as ions or radicals.

When the plasma (the active species) generated by the magnetic field contacts the surface of the wafer W, the reaction product is modified. Specifically, the impurities are released from the reaction product, for example, by collision of the plasma with the surface of the wafer W, or the elements in the reaction product are rearranged to achieve densification (densification). Thus, by continuing the rotation of the susceptor 2, the adsorption of the first process gas on the wafer W surface, the reaction of the components of the first process gas adsorbed on the wafer W surface with the second process gas, and the plasma modification of the reaction product are carried out in this order many times, and the reaction products are deposited to form a thin film. On this occasion, as described above, because each gas is uniformly supplied across the surface of each wafer W, and because the temperature within the surface of the wafer W is uniform, the thickness of the thin film becomes uniform across the surface.

Because nitrogen gas is supplied between the first process region P1 and the second process region P2, each gas is evacuated so that the first process gas, the second process gas and the plasma generating gas do not mix with each other. Further, because a purge gas is supplied to the lower side of susceptor 2, the gas to be diffused to the lower side of susceptor 2 is pushed back toward the exhaust ports 61 and 62 by the purge gas.

According to the above-described embodiment, the recess 24 for receiving and accommodating the wafer W is formed to be larger than the wafer W, and the pedestal 25 is formed to be smaller than the wafer W in the recess 24. With respect to the pedestal 25, when the wafer W is moved toward the outer peripheral portion of the susceptor 2 due to the centrifugal force of the rotation of the susceptor 2, the center position of the pedestal 25 with respect to the center position of the recess 24 is eccentrically shifted toward the outer peripheral portion so that the outer edge of the wafer W protrudes (protrudes) from the upper edge of the pedestal 25 throughout the circumferential direction. Therefore, the protrusion amount t can be set to a value that can prevent the particles generated on the back side of the wafer W from flying up on the surface side throughout the circumferential direction of the wafer W while preventing a space large enough to allow a process gas to flow into the back side of the wafer W from being formed. Accordingly, it is possible to perform the process with a high uniformity of film thickness across the surface, and at the same time, it is possible to prevent the particle from adhering to the wafer W. Therefore, even when the wafer W deforms like a mountain, because the process can start immediately (rotation of the susceptor 2) after placing the wafer on the susceptor 2, the decrease in throughput can be inhibited.

Here, the protrusion amount t when the outer edge of the wafer W contacts the inner peripheral surface of the recess 24 due to the centrifugal force of the rotation of the susceptor 2 is preferably in a range of 1 mm to 3 mm across the circumferential direction of the wafer W as described above because the particles are likely to float around the edge and to reach the surface of the wafer W when the protrusion amount t is too small, while because the protrusion amount t is too large, the thickness uniformity of the film across the surface of the wafer W is likely to deteriorate or the particles are likely to adhere to the back surface of the wafer W.

In the aforementioned example, the protrusion amounts t are set to 2 mm and 1 mm at the outer peripheral side and the center side of the susceptor 2, respectively, but the protrusion amounts t may be set to, for example, 2 mm across the circumferential direction. In this case, the diameter d, the widths L1 and L2 regarding the pedestal 25 are set, for example, to 296 mm, 4 mm and 2 mm, respectively.

Figure 19:
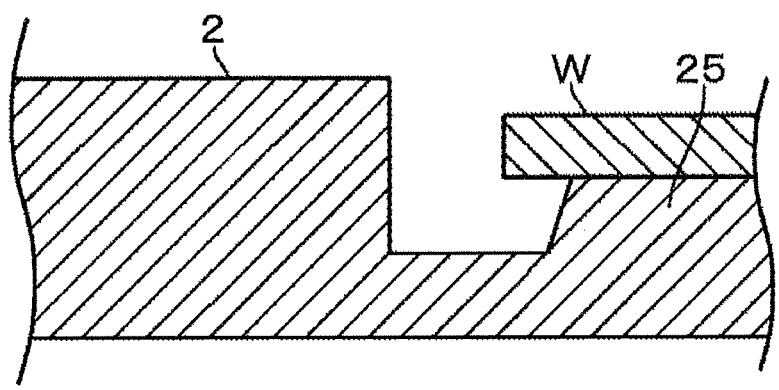
FIG. 19 is a vertical cross-sectional view illustrating a part of another example of a film deposition apparatus according to an embodiment of the present disclosure.
Figure 20:
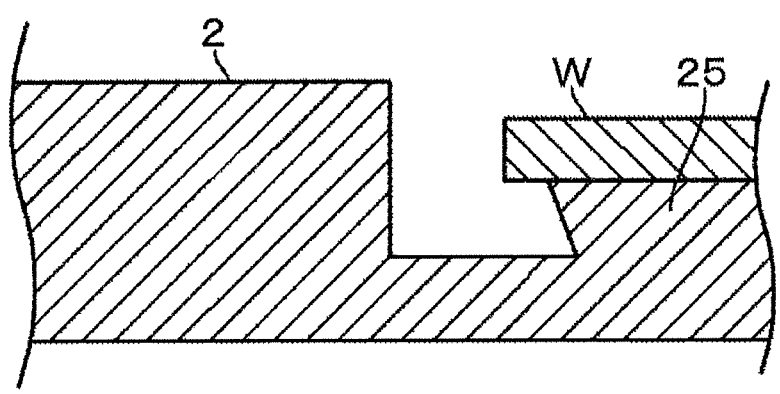
FIG. 20 is a vertical cross-sectional view illustrating a part of another example of a film deposition apparatus according to an embodiment of the present disclosure.

Here, other examples of the film deposition apparatus described above will be listed. FIG. 19 illustrates an example of forming the pedestal 25 so as to increase its diameter dimension d from the upper end surface toward the lower side. FIG. 20 illustrates an example of forming the pedestal 25 so as to decrease its diameter dimension d from the upper end surface toward the lower side. Even in the case of FIGS. 19 and 20, the protrusion amount t of the wafer W is set in the same manner as in the aforementioned example.

As described above, the pedestal 25 is disposed at the center of the recess 24 so that the substrate can be supported in contact with the substrate, and the ring-shaped groove 26 is disposed around the pedestal 25. Thus, contact between the inner wall of the recess 24 and the edge of the wafer W can be prevented, and the generation of particles caused by this contact can be prevented.

After the film deposition process is completed, the gas supply from each of the nozzles 31, 32, 34, 41, and 42 and the rotation of the susceptor 2 are stopped. Then, the susceptor 2 is intermittently rotated to carry the wafers W one by one out of the transfer port 15. When all the wafers W are transferred, one run (one rotation of the film deposition process) is completed.

Here, during the film deposition process, the film deposition process is performed not only on the surface of the wafer W but also on the surface of the susceptor 2. Thus, because a thin film is deposited, the susceptor 2 has to be cleaned to remove the thin film.

First, a conventional cleaning method will be described before describing the cleaning method according to the present embodiment.

FIGS. 21A to 21D are diagrams illustrating a conventional cleaning method. In FIGS. 21A to 21D, the overall film deposition method including a conventional cleaning method will be described.

Figure 21A:
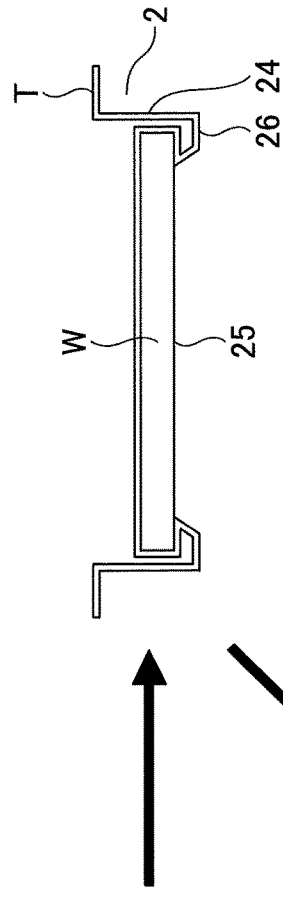
FIGS. 21A to 21D are diagrams illustrating a conventional cleaning method.

FIG. 21A is a diagram illustrating a state of the wafer W before performing a film deposition process. A wafer W is placed on a pedestal 25 in a recess 24 of a susceptor 2. A ring-shaped groove 26 is formed around the pedestal 25.

Figure 21B:
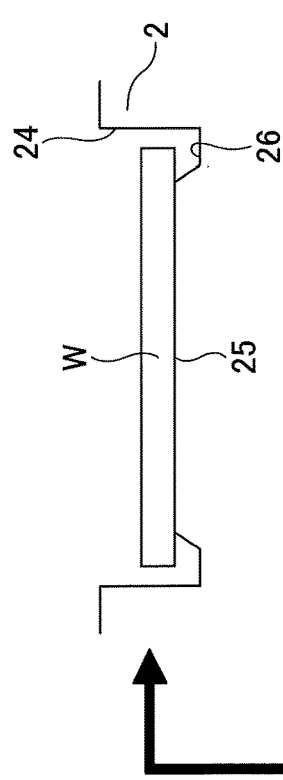

FIG. 21B is a diagram illustrating a state of the wafer W and the susceptor 2 after the film deposition process. Thin films are deposited on exposed portions of both of the wafer W and the susceptor 2. That is, the contact portion between the pedestal 25 and the back surface of the wafer W is not exposed, so a thin film is not formed thereon, and a thin film T is formed in the other portion. Specifically, the thin film T is formed on the surface of the wafer W, the side surfaces, and the outer periphery of the back surface of the wafer W that is not in contact with the pedestal 25, the side surfaces of the recesses 24, the bottom and the side surfaces of the pedestal 25, and the flat top surface of the susceptor 2.

Figure 21C:
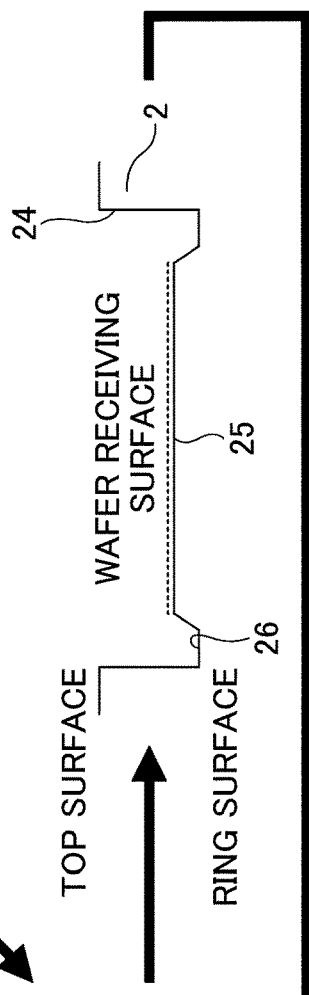

FIG. 21C illustrates a state of the susceptor 2 before dry cleaning. When the wafer W is unloaded from the recess 24, the thin film T is formed in a region other than the upper surface of the pedestal 25.

In this state, a cleaning gas is supplied from the cleaning gas nozzle 35 and dry cleaning of the susceptor 2 is performed. Generally, the dry cleaning is performed while rotating the susceptor 2. The cleaning gas is a gas that can etch off the thin film, and a fluorine-containing gas such as $ClF_3$, $NF_3$ and the like is frequently used.

Figure 21D:
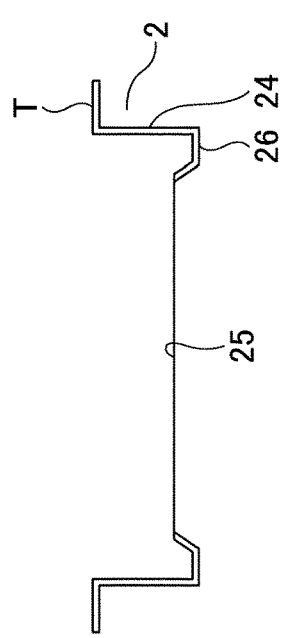

FIG. 21D illustrates a state of the susceptor 2 after the dry cleaning. When the dry cleaning is performed as illustrated in FIG. 20C, the thin film is etched in a region where the thin film T is present. However, in a region without the thin film T, the surface of the pedestal 25 is etched. Although the pedestal 25 is typically made of quartz as part of the susceptor 2, the cleaning gas used for dry cleaning uses a gas with a high etching effect, thus the cleaning gas etches not only the thin film deposited in the deposition process but also the pedestal 25 made of quartz.

Such etching removes the surface of the pedestal 25 and slightly reduces the height of the pedestal 25. When such etching is repeated during the dry cleaning, the size of the pedestal 25 gradually changes and the reproducibility of the film deposition process decreases.

FIGS. 22A to 22C are diagrams for explaining an example of a problem arising from a conventional cleaning method. In FIG. 22, the example of the problem that occurs when the height of the pedestal 25 decreases, as illustrated in FIG. 21D, will be described.

FIG. 22A is a diagram illustrating a state in which a wafer W is about to be placed on a pedestal 25 in a recess 24 in a film deposition process. As illustrated in FIG. 22A, three lift pins 28 (only one illustrated in FIG. 22A) are elevated to hold a wafer W, and the lift pins 28 are lowered to place the wafer W on the pedestal 25 in the recess 24.

FIG. 22B is a diagram illustrating a state where a wafer W has been placed on the pedestal 25 in the recess 24. As illustrated in FIG. 22B, and as described earlier, when the wafer W is placed on the pedestal 25, the wafer W is thermally deformed. In this case, as described above, it is intended that the ring-shaped groove 26 is formed so that contact between the edge of the wafer W and the inner wall of the recess 24 can be prevented, thereby preventing the generation of particles.

FIG. 22C is a diagram illustrating the relationship between the wafer W and the recess 24 when the wafer W is deformed. As illustrated in FIG. 22c, when the pedestal 25 becomes lower, the difference in height between the pedestal 25 and the ring-shaped groove 26 is reduced. Therefore, depending on the magnitude of the deformation of the wafer W, the edge of the wafer W comes into contact with the groove 26, and a particle is generated. That is, the depth of the groove 26 is initially set to a depth such that the groove 26 would not contact the wafer W even if the wafer W is deformed, but the depth of the groove 26 changes due to the decrease in height of the pedestal 25, so that the contact between the wafer W and the groove 26 cannot be avoided. The pedestal 25 and the groove 26 are thus unable to perform their intended function and adversely affect the film deposition process.

FIGS. 23A to 23C are diagrams illustrating an example of a film deposition method including a cleaning method according to the present embodiment.

FIG. 23A illustrates a state of a wafer W and a susceptor 2 before a film deposition process. Prior to the film deposition process, the wafer W is placed on a pedestal 25 in a recess 24. A ring-shaped groove 26 is formed around the pedestal 25. Under this condition, the film deposition process begins.

FIG. 23B illustrates a state of the wafer W and the susceptor 2 after the film deposition process. Through the execution of the film deposition process (film deposition step), a thin film is deposited on exposed portions of both of the wafer W and the susceptor 2. That is, the contact portion between the pedestal 25 and the back surface of the wafer W is not exposed, so a thin film is not formed, and a thin film T is formed on the other portions. Specifically, the thin film T is formed on the surface of the wafer, the side surfaces, and the outer periphery of the wafer W that is not in contact with the pedestal 25, the side surfaces of the recess 24, the bottom and the side surfaces of the pedestal 25, and the flat top surface of the susceptor 2.

FIG. 23C illustrates a state of the susceptor 2 before dry cleaning. After the wafer W is removed from the recess 24, a protective member 130 is placed on the pedestal 25 instead of the wafer W. Preferably, the protective member 130 has a shape and a size approximating to the size of the wafer W in a plan view, further preferably has a shape and a size substantially the same as the size of the wafer W in a plan view, and most preferably has the same shape and size as the shape and size of the wafer W in a plan view.

Thus, a state similar to a state in which the wafer W is placed during the film deposition process can be created, and the area covered by the wafer W during the film deposition process can be similarly covered with the protective member 130. Therefore, it is possible to cover the upper surface of the pedestal 25 without forming a thin film, and it is possible to prevent etching of the upper surface of the pedestal 25 by a cleaning gas.

Under these conditions, the susceptor 2 is rotated to supply a cleaning gas from the cleaning gas nozzle 35. As described above, a variety of gases can be used as the cleaning gas that can remove the thin film T by etching including a fluorine-containing gas such as $ClF_3$, $NF_3$, and the like.

The protective member 130 is a member used in place of the wafer W and may be referred to as a dummy wafer.

Preferably, the protective member 130 is made of a material that does not generate particles when being etched by the cleaning gas or a material that has high etching resistance to the cleaning gas and is hardly etched by the cleaning gas. In either case, the material that does not generate particles is sufficient.

Silicon is cited as an example of a material that does not generate particles when the protective member 130 is etched. The etch-resistant protective member 130 includes silicon carbide (SiC), quartz, carbon, ceramics, and the like. In the case of ceramics, it is preferable to use a material that does not cause metal contamination. Using silicon is highly preferred because silicon does not adversely affect the film deposition process because silicon is the same material as the wafer W. However, because silicon is scraped by etching, silicon is used for a disposable use. On the other hand, SiC, quartz, carbon, ceramics, and the like have the advantage of being used multiple times because of their high etching resistance. However, because they are different materials from the wafer W and are not complete dummy wafers, using silicon as the protection member 130 may be safe and preferable depending on the process. Thus, a preferable material can be used as the protective member 130 depending on the intended use.

The size of the protective member 130 in a plan view may be of various sizes, as long as the protective member 30 has a size large enough to cover the pedestal 25. However, in the cleaning process, because the cleaning is performed while the susceptor 2 is rotated, a centrifugal force is applied to the wafer W, and the cleaning is frequently performed in a state of the outer edge of the wafer W in contact with the inner peripheral surface of the outer side of the recess 24. In this case, if the protective member 130 W differs from the wafer W in size, the film deposition time and conditions may be slightly different from those when using the wafer W, and therefore the positional balance between the deposition amount and the etching amount may be different. Hence, it is preferable to use the protective member 130 having the shape and size approximating to the wafer W, and is the most preferable to use the same shape and size as the wafer W, as much as possible. Even in the exposed portion of the surface of the susceptor 2, it is more preferable to perform the cleaning depending on the exposure level corresponding to the film deposition amount formed during the film deposition process, because a thin film is formed having different film thicknesses between the fully exposed portion and the outer peripheral portion of the groove 26 that is likely to be covered with the wafer W.

FIG. 23D illustrates a state of the susceptor 2 after dry cleaning. As illustrated in FIG. 23D, the pedestal 25 is covered and protected by the protective member 130 so as not to contact the cleaning gas and not to be etched. In addition, the region in which the thin film T is formed can be the same as a state before the film deposition process in which the thin film T is removed and the surface of the susceptor 2 is exposed.

As described above, according to the cleaning method and the film deposition method according to the present embodiment, the protective member 130 is placed at a location where the wafer W is placed in the film deposition process in the cleaning step, and dry cleaning is performed. Thus, it is possible to perform cleaning in a state similar to the state during the film deposition. By performing the dry cleaning in which the etching amount is distributed in proportion to the film thickness, the etching amount increases at a location where the film is thick, and the etching amount decreases at a location where the film is thin. Thus, only the deposited film T can be etched, and the cleaning can be performed without scraping the surface of the susceptor 2. Without etching the surface of susceptor 2, quartz particles do not occur and thus do not adversely affect the film deposition process. Also, because the protective member 130 is made of a material that does not adversely affect the deposition process even if being etched, or a highly etch-resistant material, particles arising from the protective member 130 do not adversely affect the film deposition process.

As described above, according to the cleaning method and the film deposition method according to the present embodiment, the susceptor 2 can be cleaned without adversely affecting the film deposition process by contamination and the like, and the life of the susceptor 2 can be extended.

After the cleaning, the wafer W is carried into the vacuum chamber 1 and the film deposition process is performed again. The cleaning process and the film deposition process are alternately carried out, but the cleaning process does not have to be performed corresponding to the film deposition process on a one-to-one basis, such as one cleaning process to one film deposition process. Therefore, the cleaning frequency may be changed depending on the intended use. For example, one cleaning process may be performed after two film deposition processes are carried out, or one cleaning process may be performed after three film deposition processes are carried out.

Although the cleaning method and the film deposition method have been described with reference to an example of applying the cleaning method and the film deposition method to the film deposition apparatus including the pedestal 25 and the groove 26 formed in the recess 24, these are not essential, and the cleaning method and the film deposition method according to the present embodiment can be applied to various film deposition apparatuses.

This is because the protective member 130 can be placed so as to be similar to a condition of the film deposition, and the cleaning can be performed under the same condition as that of the film deposition on the wafer W, without respect to the presence of absence of the pedestal 25 and the groove 26.

As described above, according to the film deposition method of the present embodiment, it is possible to perform cleaning without damaging a susceptor.

Although the preferred embodiments of the present disclosure have been described in detail above, the present disclosure is not limited to the embodiments described above, and various modifications and substitutions can be made to the embodiments described above without departing from the scope of the present disclosure.

What is claimed is:

1. A cleaning method for dry cleaning a susceptor disposed in a process chamber of a film deposition apparatus, comprising steps of:

placing a protective member on a substrate receiving region provided in the susceptor; and supplying a cleaning gas to the susceptor having the protective member placed on the substrate receiving region, thereby removing a film deposited on a surface of the susceptor by etching, wherein the substrate receiving region is formed as a recess having a shape along an outer shape of a substrate in a plan view, wherein the recess includes a pedestal disposed at a center of the recess to form a bottom surface of the recess to directly contact and receive the substrate and the protective member, and a groove disposed around the pedestal, the groove being lower than the pedestal in height, a lateral surface of the pedestal and the groove being continuously formed and directly joined to form a surface of the recess, and wherein the step of removing the film deposited on the surface of the susceptor by etching is performed while placing the protective member on the pedestal.

2. The cleaning method as claimed in claim 1, wherein the protective member has substantially a same shape as a substrate to be processed by a film deposition process in a plan view.

3. The cleaning method as claimed in claim 1, wherein the susceptor is made of quartz.

4. The cleaning method as claimed in claim 1, wherein the step of removing the film deposited on the surface of the susceptor by etching is performed while rotating the susceptor.

5. The cleaning method as claimed in claim 1, wherein the cleaning gas is a fluorine-containing gas.

6. The cleaning method as claimed in claim 1, wherein a plurality of substrate receiving regions is provided along a circumferential direction of the susceptor.

7. The cleaning method as claimed in claim 2, wherein the protective member is arranged at a same location as a substrate to be processed by a film deposition process.

8. The cleaning method as claimed in claim 2, wherein the protective member is made of a material that does not cause particles upon being etched by the cleaning gas.

9. The cleaning method as claimed in claim 2, wherein the protective member is made of a material having an etching resistance greater than an etching resistance of the susceptor against the cleaning gas.

10. The cleaning method as claimed in claim 8, wherein the protective member is made of a material same as a material of the substrate to be processed.

11. The cleaning method as claimed in claim 8, wherein the protective member and the substrate to be processed is made of silicon.

12. The cleaning method as claimed in claim 9, wherein the protective member is made of quartz or silicon carbide.

* * * * *